United States Patent [19]
Pinarbasi

[11] Patent Number: 5,883,764
[45] Date of Patent: Mar. 16, 1999

[54] MAGNETORESISTIVE SENSOR HAVING MULTI-LAYERED REFRACTORY METAL CONDUCTOR LEADS

[75] Inventor: Mustafa Pinarbasi, Morgan Hill, Calif.

[73] Assignee: International Business Machines Corporation, Armonk, N.Y.

[21] Appl. No.: 943,322

[22] Filed: Oct. 3, 1997

[51] Int. Cl.⁶ .................................................. G11B 5/39
[52] U.S. Cl. .............................................................. 360/113
[58] Field of Search ............................................. 360/113

[56] References Cited

U.S. PATENT DOCUMENTS

| | | | |
|---|---|---|---|
| 4,914,538 | 4/1990 | Howard et al. | 360/113 |
| 5,262,914 | 11/1993 | Chen et al. | 360/113 |
| 5,268,806 | 12/1993 | Goubau et al. | 360/113 |
| 5,327,313 | 7/1994 | Nishioka et al. | 360/113 |
| 5,479,696 | 1/1996 | McNeil | 29/603 |
| 5,491,600 | 2/1996 | Chen et al. | 360/113 |
| 5,508,866 | 4/1996 | Gill et al. | 360/113 |

FOREIGN PATENT DOCUMENTS

| | | | |
|---|---|---|---|
| 552890-A2 | 7/1993 | European Pat. Off. | G01R 33/06 |
| 590905-A2 | 4/1994 | European Pat. Off. | G11B 5/39 |
| 6-103533 | 4/1994 | Japan | G11B 5/39 |
| 7-73418 | 3/1995 | Japan | G11B 5/39 |
| 7-114712 | 5/1995 | Japan | G11B 5/39 |
| 7-114713 | 5/1995 | Japan | G11B 5/39 |

*Primary Examiner*—A. J. Heinz
*Attorney, Agent, or Firm*—Paik Saber

[57] ABSTRACT

A magnetoresistive sensor having end regions separated from a central active region. The central region comprises magnetoresistive material. Each of the end regions comprises a biasing material for longitudinally biasing the magnetoresistive material in the central region. Each of the end regions also include a lead structure formed over the biasing material for receiving electrical current. The lead structure includes a first refractory metal formed over and in contact with the biasing material; a second refractory metal distinct from the first refractory metal and formed over and in contact with the first refractory metal; and a lead conductor layer formed over and in contact with the second refractory metal. The multi-refractory lead structure has an overall resistance that is much lower than a single refractory metal lead structure.

26 Claims, 8 Drawing Sheets

MAGNETORESISTIVE SENSOR HAVING MULTI-LAYERED REFRACTORY METAL CONDUCTOR LEADS

BACKGROUND OF THE INVENTION

1. Field of the Invention

This invention relates generally to magnetic transducers for reading information signals from a magnetic medium and, in particular, to a process for fabrication of improved conductivity leads for magnetoresistive read transducers.

2. Description of Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which the MR element resistance varies as the square of the cosine of the angle between the magnetization of the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe or Co or Ni—Fe/Co) separated by a layer of nonmagnetic material (e.g., copper) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., NiO or Fe—Mn) layer. The magnetization of the other ferromagnetic layer, referred to as the free layer, however, is not fixed and is free to rotate in response to the field from the information recorded on the magnetic medium (the signal field). In the SV sensors, SV resistance varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage.

In addition to the magnetoresistive material, the MR sensor has conductive lead structures for connecting the MR sensor to a sensing means and a sense current source. Typically, a constant current is sent through the MR sensor through these leads and the voltage variations caused by the changing resistance are measured via these leads.

Figure 1:
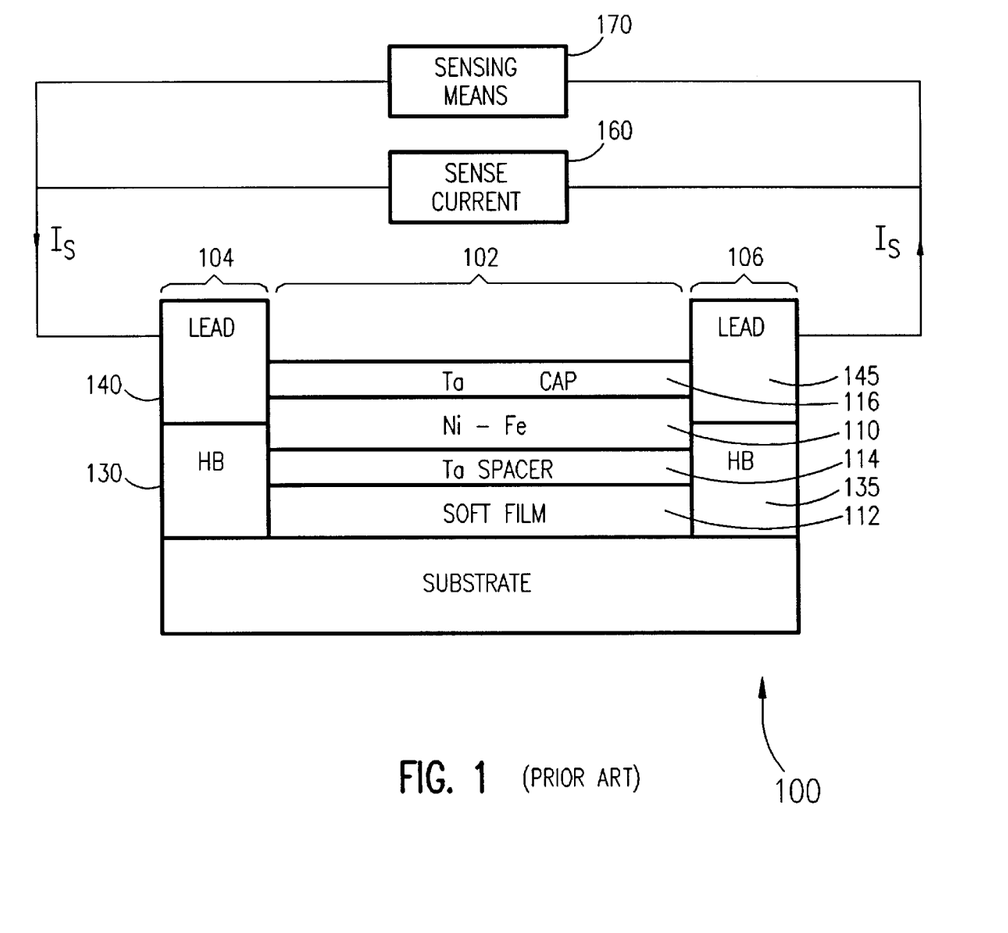
FIG. 1 is a schematic diagram of the ABS view of the thin film structure of a prior art AMR sensor device.

FIG. 1 shows a prior art AMR sensor 100 comprising end regions 104 and 106 separated by a central region 102. Soft film 112, spacer layer 114, MR layer 110 and cap layer 116 are formed in the central region 102. Hard bias layers 130 and 135 formed in the end regions 104 and 106, respectively, provide longitudinal bias for the MR layer 110. Leads 140 and 145 formed over hard bias layers 130 and 135, respectively, provide electrical connections for the flow of the sensing current $I_S$ from a current source 160 to the MR sensor 100. Sensing means 170 connected to leads 140 and 145 sense the change in the resistance due to changes induced in the MR layer 110 by the external magnetic field (e.g., field generated by a data bit stored on a disk).

Figure 2:
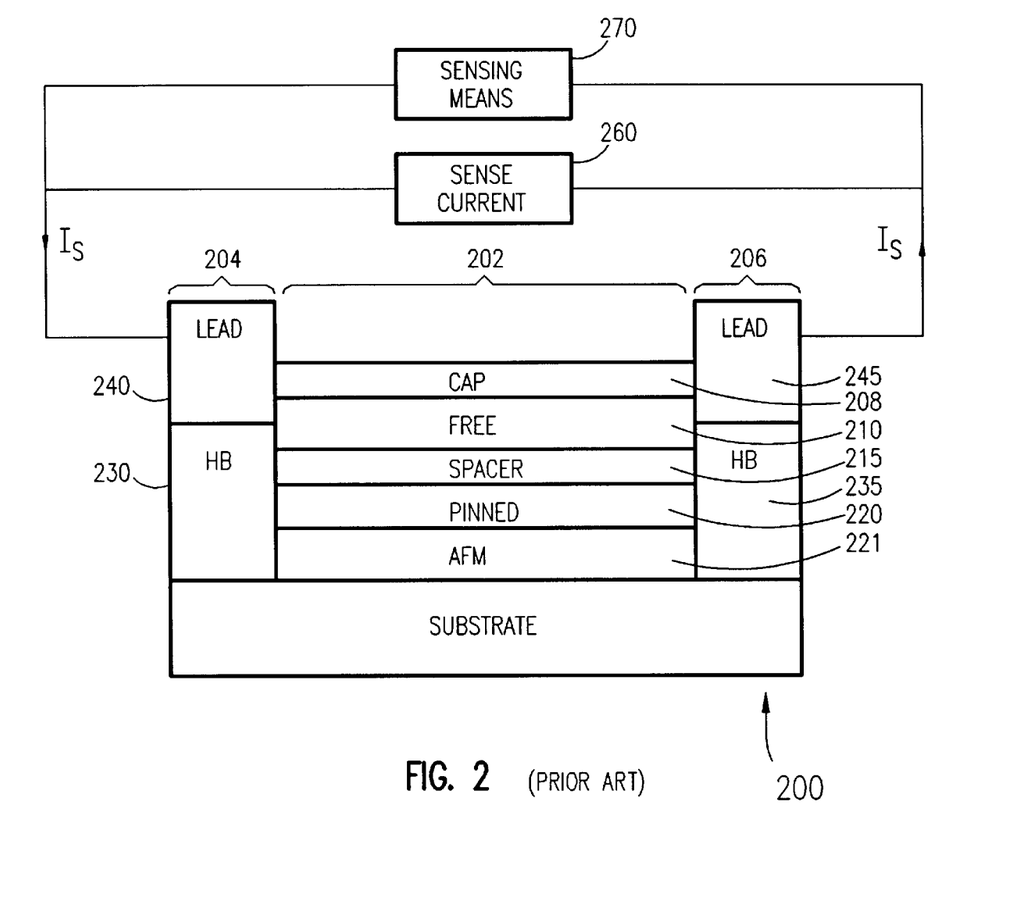
FIG. 2 is a schematic diagram of the ABS view of the thin film structure of a prior art SV sensor device.

FIG. 2 shows a prior art SV sensor 200 comprising end regions 204 and 206 separated by a central region 202. A free layer (free ferromagnetic layer) 210 is separated from a pinned layer (pinned ferromagnetic layer) 220 by a non-magnetic, electrically-conducting spacer 215. The magnetization of the pinned layer 220 is fixed by an antiferromagnetic (AFM) layer 221. Cap layer 208, free layer 210, spacer layer 215, pinned layer 220 and AFM layer 221 are all formed in the central region 202. Hard bias layers 230 and 235 formed in the end regions 204 and 206, respectively, provide longitudinal bias for the MR free layer 210. Leads 240 and 245 formed over hard bias layers 230 and 235, respectively, provide electrical connections for the flow of the sensing current $I_S$ from a current source 260 to the MR sensor 200. Sensing means 270 connected to leads 240 and 245 sense the change in the resistance due to changes induced in the free layer 210 by the external magnetic field (e.g., field generated by a data bit stored on a disk).

The preferred material for constructing the leads in both the AMR sensors and the SV sensors is a highly conductive material such as a metal. In the MR sensors conductor leads face much more stringent requirements when compared to other interconnect conductors, such as for example semiconductor devices. This is because the conductor leads, as well as the MR sensor films, are exposed at the sensor's air bearing surface (ABS). The leads have little protection from the severe mechanical environment where head-disk contact occurs frequently, and from the severe corrosion environment where chemical attack occurs both during processing and also in actual use where the environment may not be well controlled.

Early MR sensors were fabricated using pure gold metallurgy and other highly conductive materials as the lead conductor. However, due to the exposure at the ABS, these soft materials had the potential reliability risks of electromigration, smearing and nodule formation. Tungsten and tantalum were introduced as gold substitutes due to their mechanical properties of being very hard while still having good electrical conductivity.

Referring again to FIG. 2, the electrical resistance of the leads 240, 245 connecting the SV sensor 200 to the sense current source 260 is an important factor influencing operating conditions of the SV sensor and its sensitivity as a read 5 transducer. High lead resistance can result in excessive IR heating of the SV sensor structure when lead resistance becomes significant. A second problem of high lead resistance is that the effective SV sensor sensitivity to the signal field is degraded when lead resistance becomes a significant fraction of 10 the total resistance measured by sensing means 270.

The resistance $R_{L1}$ of lead 240, resistance $R_{L2}$ of lead 245 and the resistance $R_{SV}$ of the central region 202 of the SV sensor 200 together form a series electrical circuit through which the sense current $I_S$ flows. The resistance through which sense current $I_S$ flows can be expressed as $R_T = R_{SV} + R_L$ where the total lead resistance $R_L = R_{L1} + R_{L2}$. It is desirable to have the sense current $I_S$ flowing through the SV sensor resistance $R_{SV}$ as high as possible to maximize the voltage signals measured by sensing means 270. The sense current $I_S$ flowing through $R_{SV}$ generates heat $I_S R_{SV}$ which raises the temperature of SV sensor 200. Current $I_S$ flowing through the lead resistance $R_L$ generates additional heat $I_S R_L$ which also contributes to the rise in temperature of the SV sensor 200. The allowable operating temperature for reliable SV sensor operation is about 120 degrees C. If lead resistance $R_L$ becomes a significant fraction of the total resistance $R_T$, the lead resistance can become a limiting factor on the maximum allowable sense current $I_S$.

The total resistance sensed by the sensing means 270 is $R_T = R_{SV} + R_L$. The effect of signal field changes on the SV sensor 200 is a change of resistance by an amount of delta$R_{SV}$. The effective sensitivity of the SV sensor 200 as sensed by the sensing means 270 can be expressed by the ratio delta$R_T/R_T$. Since lead resistance $R_L$ does not change with signal field, delta$R_T$ is equal to delta$R_{SV}$. Thus the effective sensitivity of the SV sensor 200 as sensed by the sensing means 270 is given by delta$R_{SV}/(R_{SV}+R_L)$. Comparison of this expression with the expression for the GMR coefficient delta$R_{SV}/R_{SV}$ of the SV sensor 200 shows that the effective sensitivity is significantly degraded as lead resistance becomes comparable to the SV sensor resistance.

In present SV sensors, the SV sensor resistance $R_{SV}$ is typically about 30 ohms. Lead resistance $R_L$ is typically about 15 to 18 ohms. The effective sensitivity is therefore degraded by about $100R_L/(R_{SV}+R_L)=35\%$. For AMR sensors, typical sensor resistance is 30 to 50 ohms and lead resistances are 15 ohms, so that effective sensitivity is degraded by about 27%.

As higher data density disk drives are developed, smaller MR sensors with thinner lead layer structures are required to provide the higher data resolution. Lead resistance becomes an even greater fraction of the total MR sensor resistance in these smaller devices. Therefore, there is a need for low resistance leads that do not limit performance of present and future MR sensors.

SUMMARY OF THE INVENTION

It is an object of the present invention to provide a very thin and highly conductive MR conductive leads structure that has improved electrical conductivity.

According to the present invention, an MR sensor has a first and second end regions separated from each other by a central region in where a magnetoresistive material is formed in the central region. The magnetoresistive material has a first edge and a second edge defining the width of the read head. First and second hard bias material layers are formed in the first and second end regions, respectively. The hard bias layers provide longitudinal bias to the magnetoresistive material to maintain the desired orientation of the magnetization of the magnetoresistive material at the first and second edge. A first multilayered lead structure is deposited on the first hard bias layer and a second multilayered lead structure is deposited on the second hard bias layer. The first and second multilayered lead structures are constructed of multiple layers of thin film materials comprising a first layer of a refractory metal, a second layer of a second refractory metal, and a layer of highly conductivity metal. The first and second layers of refractory metals act as first and second seed layers where seed layers are any layer deposited to modify the crystallographic texture or grain size of subsequent layers. The multilayered lead structures formed according to the present invention have significantly improved lead conductance over prior art lead structures.

The above as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
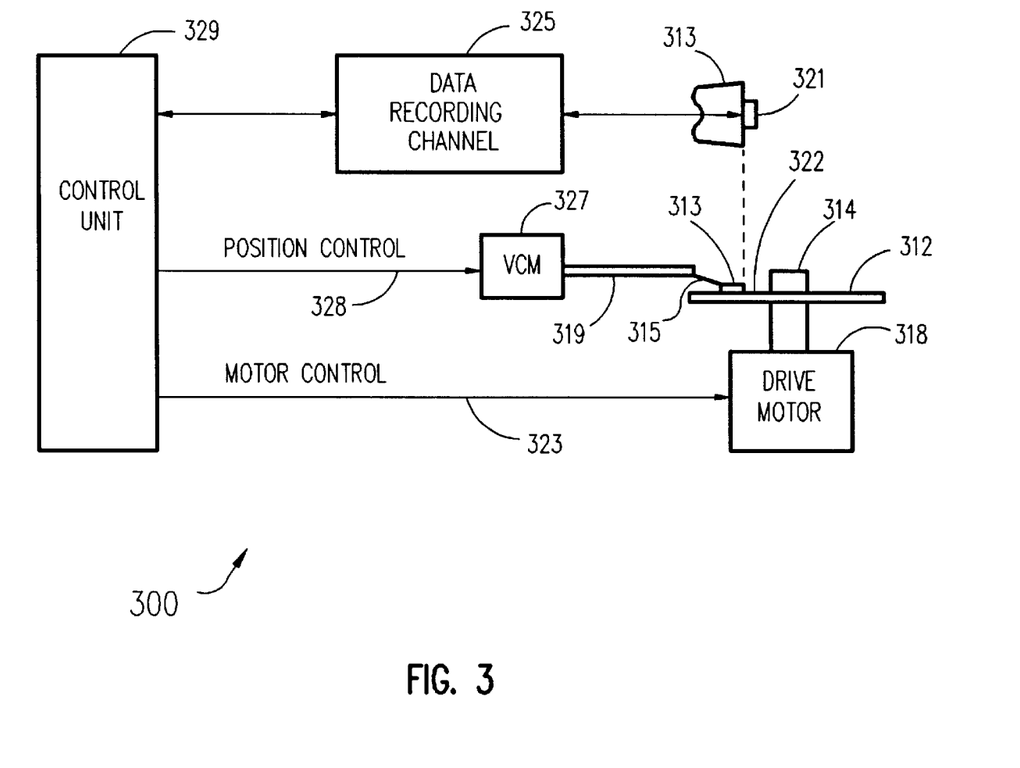
FIG. 3 is a block diagram of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
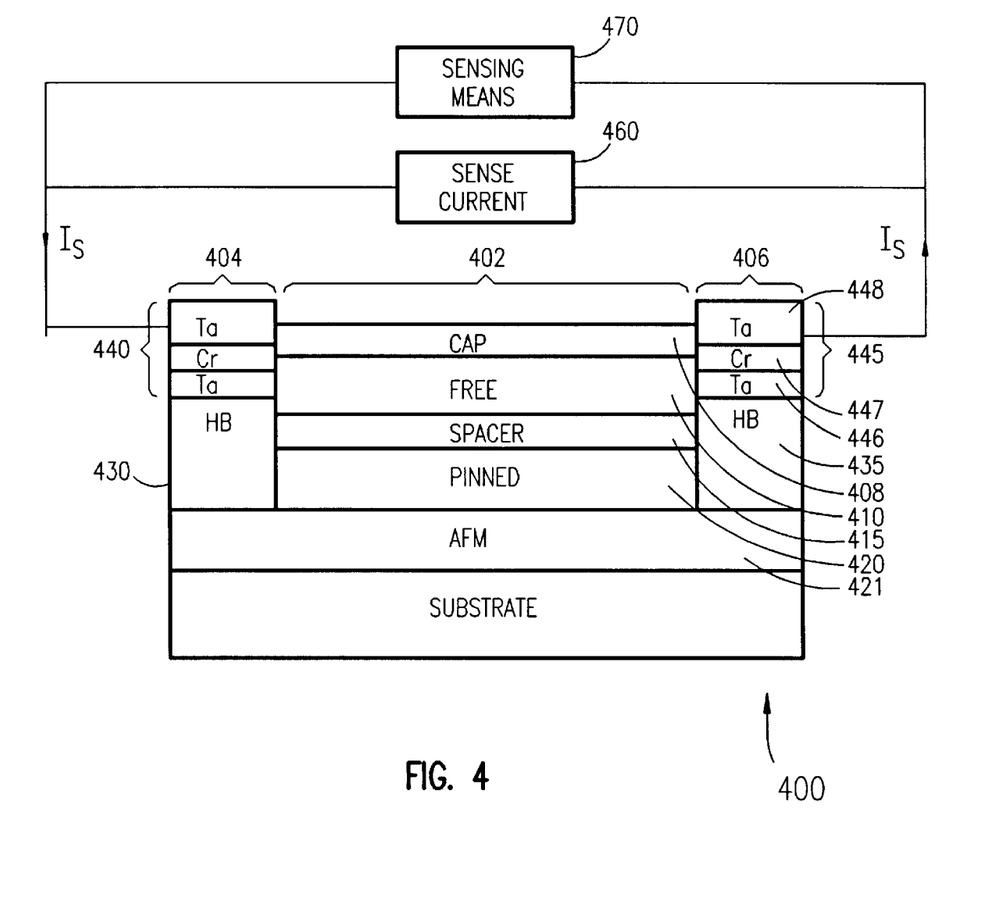
FIG. 4 is a schematic diagram of the ABS view of the thin film structure of the preferred embodiment SV sensor of the present invention.

FIG. 4 shows an air bearing surface (ABS) view of the SV sensor 400 manufactured according to the preferred embodiment of the present invention. SV sensor 400 comprises end regions 404 and 406 separated by a central region 402. A free layer (free ferromagnetic layer) 410 is separated from a pinned layer (pinned ferromagnetic layer) 420 by a non-magnetic, electrically-conducting spacer layer 415. The magnetization of the pinned layer 420 is fixed by an anti-ferromagnetic (AFM) layer 421. Cap layer 408, free layer 410, spacer layer 415, and pinned layer 420 are all formed in the central region 402. The AFM layer 421 may be formed in the central region 402, or alternatively as in the preferred embodiment, the AFM layer 421 is formed in the end regions 404, 406 and in the central region 402. Hard bias layers 430 and 435 formed in the end regions 404 and 406, respectively, and in contact with the MR sensor layers in the central region 402, provide longitudinal bias for the MR free layer 410. Leads 440 and 445 formed over hard bias layers 430 and 435, respectively, provide electrical connections for the flow of the sensing current $I_S$ from a current source 460 to the SV sensor 400. Sensing means 470 connected to leads 440 and 445 sense the change in the resistance due to changes induced in the free layer 410 by the external magnetic field (e.g., field generated by a data bit stored on a disk).

In this embodiment, free layer 410 is formed of Ni—Fe, pinned layer 420 is formed of Ni—Fe, and spacer layer 415 is preferably formed of copper (Cu). Alternatively, pinned layer 420 may comprise a multilayer film structure such as a first ferromagnetic layer/spacer/second ferromagnetic layer (e.g., Co/Ru/Co) where the first and second ferromagnetic layers are antiferromagnetically coupled by a spacer layer.

In the preferred embodiment of the present invention, leads 440 and 445 comprise a multilayer structure formed on and in direct contact with the hard bias layers 430 and 435. In this embodiment, the hard bias layers 430 and 435 comprise a seed layer formed on the AFM layer 421 and a layer of CoPtCr formed directly on and in contact with the seed layer. The seed layer is preferably made of Cr. The leads 440 and 445 comprise a first seed layer 446 of a first refractory metal formed directly on and in contact with the CoPtCr hard bias layers 430 and 435, a second seed layer 447 of a second refractory metal, distinct from the first refractory metal, formed on the first seed layer 446, and a lead layer 448 of highly conductive metal formed on the second seed layer 447.

In the preferred embodiment, the first refractory metal of the first seed layer 446 is tantalum (Ta) (approximately 35 Å thick), the second refractory metal of the second seed layer 447 is chromium (Cr) (approximately 35 Å thick), and the highly conductive metal of the lead layer 448 is tantalum (Ta) (approximately 750 Å thick).

The bi-layer seed structure of the present invention having first and second seed layers of distinctly different materials improves the lead conductance by approximately 33% for the SV sensor of the preferred embodiment compared to an SV sensor with only a single seed layer of Cr (35 Å thick) and a lead layer of tantalum (750 Å thick). The improved lead conductance obtained with the present invention is very important to MR sensor operation in high data density applications where MR sensor layer thicknesses are significantly reduced.

Figure 5:
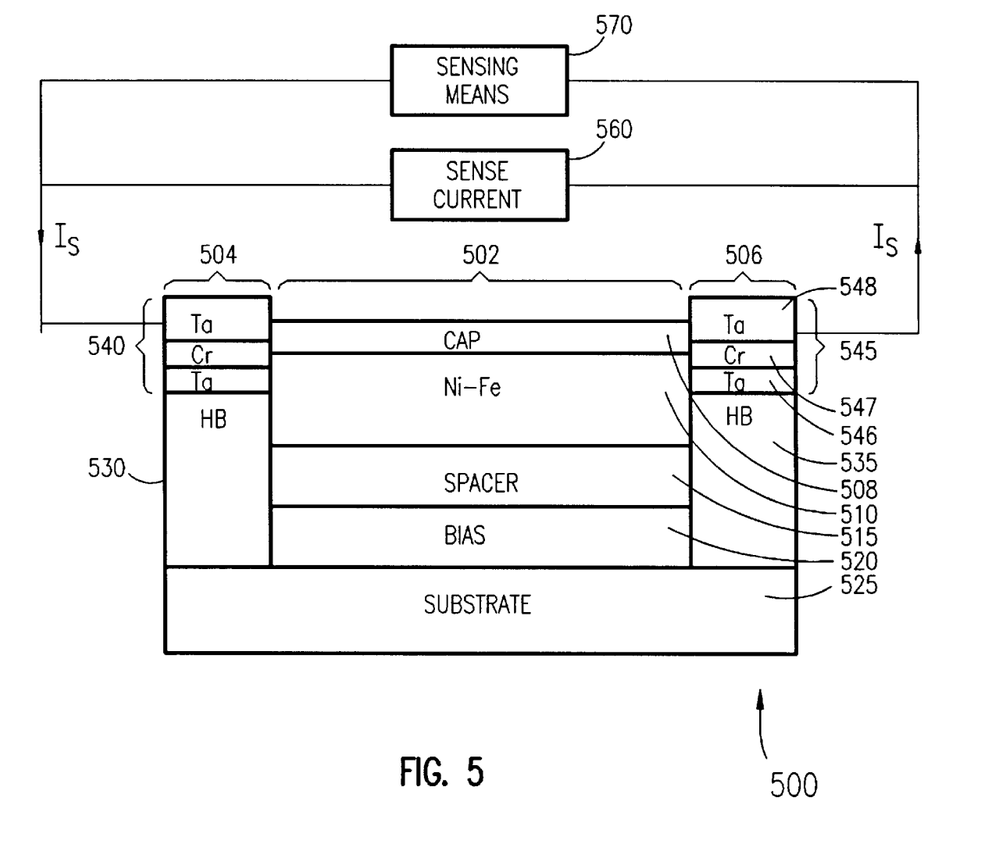
FIG. 5 is a schematic diagram of the ABS view of the thin film structure of an AMR sensor embodiment of the present invention.

FIG. 5 is an ABS view of a second embodiment of the present invention showing an AMR sensor 500 manufactured with the improved conductance multilayer lead structure of the preferred embodiment. AMR sensor 500 comprises end regions 504 and 506 separated by a central region 502. An Ni—Fe MR layer 510 is separated from a bias layer 520 by a non-magnetic spacer layer 515. Cap layer 508, MR layer 510, spacer layer 515, and bias layer 520 are all formed in the central region 502. Hard bias layers 530 and 535 formed in the end regions 504 and 506, respectively, provide longitudinal bias for the MR layer 510. Leads 540 and 545 formed over hard bias layers 530 and 535, respectively, provide electrical connections for the flow of the sensing current $I_S$ from a current source 560 to the MR sensor 500. Sensing means 570 connected to leads 540 and 545 sense the change in the resistance induced in the MR layer 510 by the external magnetic field.

In this embodiment, leads 540 and 545 comprise a multilayer structure formed on and in direct contact with the hard bias layers 530 and 535. In this embodiment, the hard bias layers 530 and 535 comprise a Cr seed layer formed on the substrate 525 with a layer of CoPtCr formed directly on and in contact with the Cr seed layer. The leads 540 and 545 comprise a first seed layer 546 of a first refractory metal formed directly on and in contact with the CoPtCr hard bias layers 530 and 535, a second seed layer 547 of a second refractory metal formed on the first seed layer 546, and a lead layer 548 of a highly conductive metal formed on the second seed layer 547. In the preferred embodiment, the first refractory metal of the first seed layer 546 is tantalum (Ta) (approximately 35 Å thick), the second refractory metal of the second seed layer 547 is chromium (Cr) (approximately 35 Å thick), and the highly conductive metal of the lead layer 548 is tantalum (Ta) (approximately 750 Å thick).

The bi-layer seed structure of the present invention improved the lead conductance by approximately 17% for the AMR sensor of the preferred embodiment compared to an AMR sensor with a single seed layer of Cr (35 Å thick) and a lead layer of tantalum (750 Å thick).

Table I summarizes the lead conductance improvements obtained by using the bi-layer seed structure of the present invention for both SV and AMR sensor lead structures.

TABLE 1

Sheet conductance of prior art lead structure and present invention lead structure in mhos/sq.

|  | Prior Art Cr/Ta | Present Invention Ta/Cr/Ta | Improvement |
| --- | --- | --- | --- |
| SV Sensor Lead | 0.357 | 0.476 | 33% |
| AMR Sensor Lead | 0.410 | 0.478 | 17% |

Calculations by the present inventor have been made to resolve whether the additional thickness of the lead structure due to introduction of an added seed layer could itself account for the observed conductance improvements achieved with a bi-layer seed structure. The 35 Å thickness of the Ta first seed layer represents about 5% of the 750 Å lead layer thickness. Since conductance of a thin film layer is expected to be proportional to the layer thickness, a 5% improvement in conductance of the lead structure with the bi-layer seed is the maximum improvement that could be expected (assumes conductivity of the Ta first seed layer material is equal to the conductivity of the thick Ta lead layer material). Measurements of the conductivity of the Ta seed layer material have shown that its conductivity is actually significantly lower than the conductivity of the Ta conductive lead layer material, such that only about 1% of the improved conductivity of the lead structure of the present invention is due to the added 35 Å thickness of the Ta first seed layer.

Experiments by the present inventor with Ta conductive lead structures having a single Cr seed layer of varying thickness have been made to see if the improvement in Ta lead conductance can be achieved with a thicker single seed layer. For the SV sensor lead structure Substrate/NiO/Cr/CoPtCr/Cr/Ta lead, increasing the thickness of the Cr seed layer for the Ta lead from 35 Å to 75 Å resulted in an improved lead sheet conductance of only 14% compared with the 33% improvement obtained with an equal total thickness of Ta/Cr bi-layer seed.

Similar experiments with the AMR sensor lead structure Substrate/Cr/CoPtCr/Cr/Ta lead indicate that increasing the thickness of the Cr seed layer for the Ta lead from 35 Å to 70 Å results in an improved Ta lead conductance of only 4% compared with the 17% improvement obtained with an equal total thickness of Ta/Cr bi-layer seed.

The foregoing calculations and experiments have shown that the large improvement in lead conductance achieved with the bi-layer seed structure of the present invention is an unexpected and novel advance in the art. The use of a multilayer seed structure, and in particular the bi-layer seed structure of this embodiment, has the effect of isolating the lead structure from deleterious effects of changes in the thickness or structure of sublayers such as the CoPtCr hard bias layers on which the conductive lead structure is formed.

Figure 6:
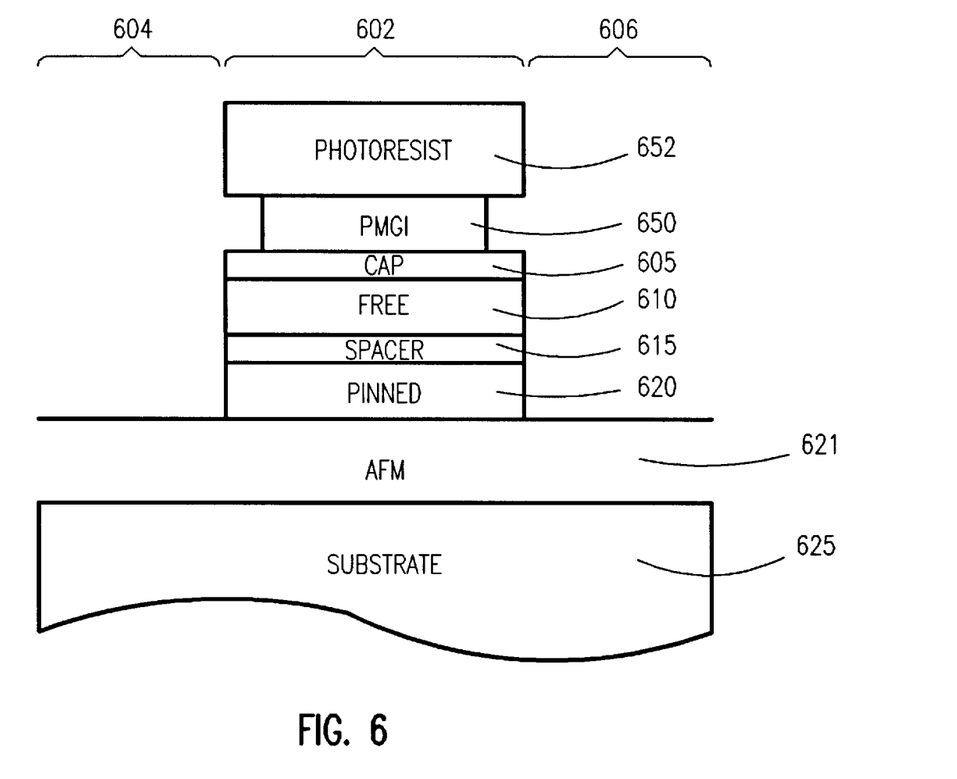
FIG. 6 shows an SV sensor at the processing step after ion milling definition of the active region of the sensor.
Figure 7:
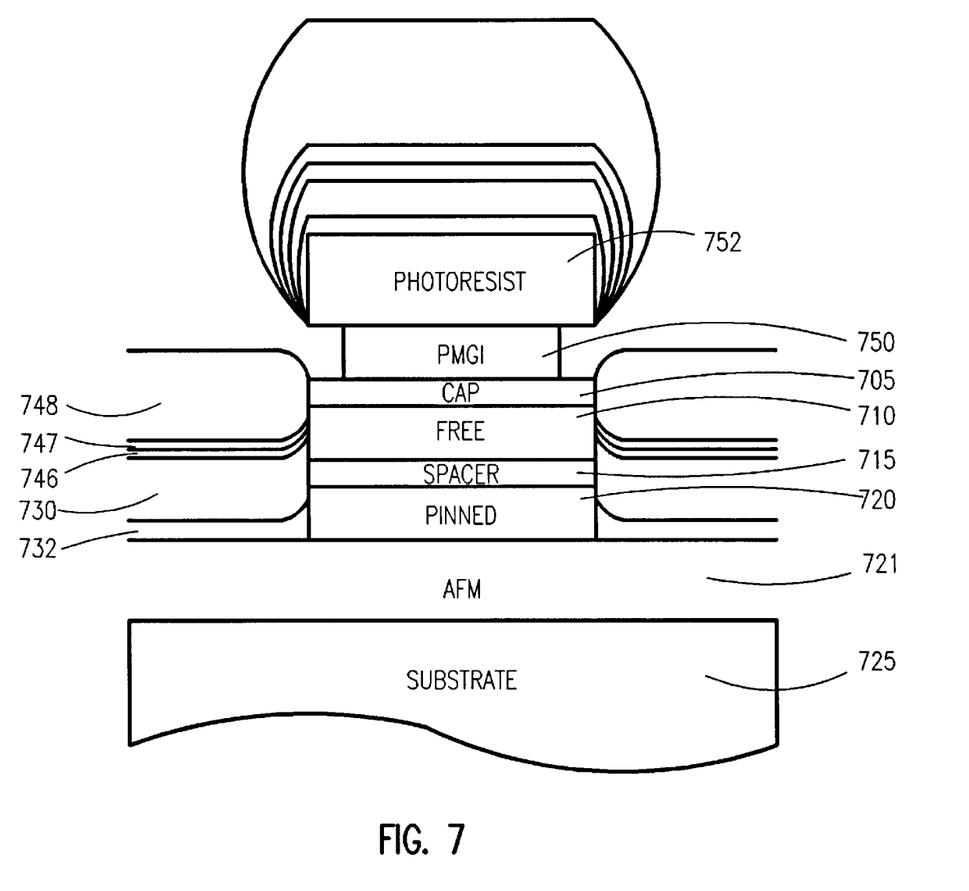
FIG. 7 shows an SV sensor after the processing step of depositing the biasing and conductor lead structure according to a preferred embodiment of the present invention.
Figure 8:
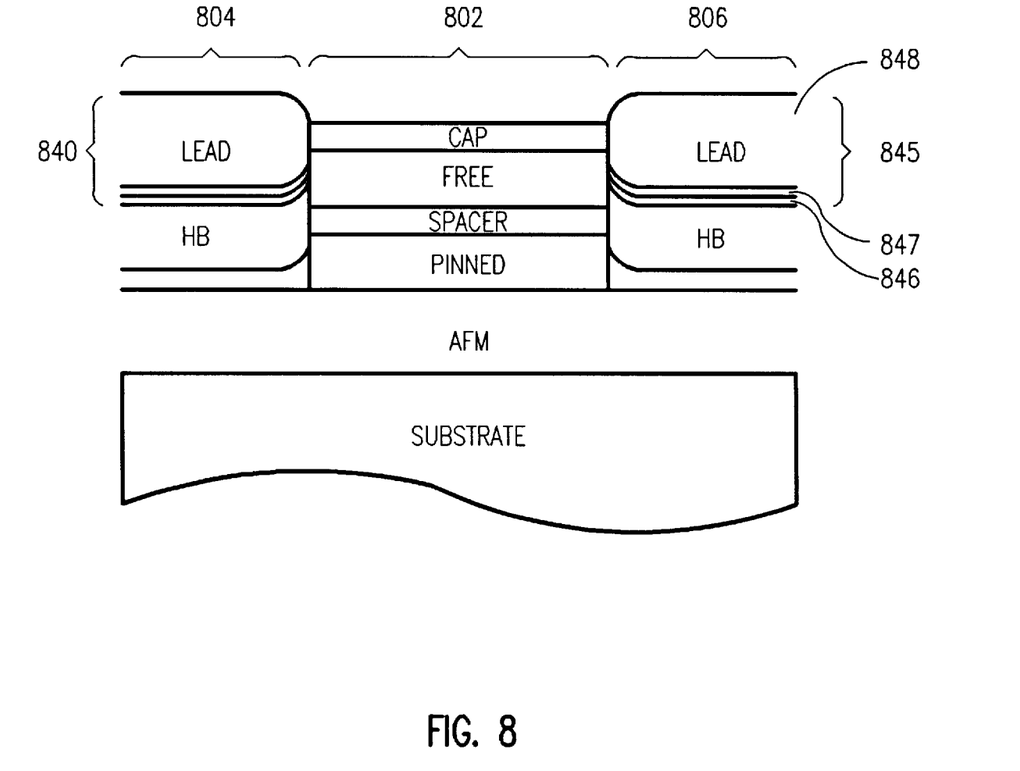
FIG. 8 shows an SV sensor having conductor lead structure according to the present invention after the photoresist and PMGI have been lifted off.

Referring now to FIGS. 6, 7 and 8, the method of making the best embodiment of the present invention of the SV sensor of FIG. 4 is shown. FIG. 6 shows the multilayered SV sensor structure after the processing steps defining the central region 602 of the SV sensor have been completed. To reach this stage of the processing, the multilayered SV sensor structure was deposited by successive ion beam sputtering depositions as is well established in the art. Polydimethylglutarimide (PMGI) layer 650 is formed in between photoresist layer 652 and capping layer 605 in order to facilitate the lift-off process when removing photoresist 652. Photoresist 652 is laid-out over the multilayers that comprise the active central region of the SV sensor. The photoresist masks the active region of the sensor during the ion beam milling and deposition process for the conductive lead structures to be deposited on the end regions 604 and 606. The layers lying under the photoresist have been protected during the ion milling process and remain intact. The portions of the pinned layer 620, spacer layer 615, free layer 610, and capping layer 605 not protected by the photoresist during the ion milling process have been removed. The substrate 625 and NiO AFM layer 621 are not affected by the ion milling process.

FIG. 7 show the SV sensor after the hard bias and conductive lead structures have been deposited using ion beam sputtering deposition according to the present invention. First, Cr layer 732, which overlays NiO AFM layer 721, is deposited, and hard bias layer 730 is laid over the Cr layer. Hard bias layer 730 is a thin layer of suitable hard magnetic material such as CoPtCr that is deposited in good interfacial contact with the free layer 710 of NiFe such that the two layers touch. The present invention comprises at least two layers of refractory metals deposited on the hard bias layer to provide a multilayer seed structure for the current carrying highly conducting lead material. In the preferred embodiment, first seed layer 746 of Ta is deposited on the CoPtCr hard bias layer 730, followed by second seed layer 747 of Cr deposited on said first seed layer. A much thicker, highly conductive lead layer 748 of Ta is then deposited on and in contact with second seed layer 747. During the deposition process, these layers are formed over the photoresist 752 and the PMGI 750. However, at the PMGI 750 a disconnect occurs because of the photoresist 752 overhang. In the next process step, a solvent is introduced causing the photoresist 752 to be lifted off. The solvent dissolves PMGI 750 to allow photoresist 752 and the hard bias and lead structure layers deposited thereon to be washed away. The result is the SV sensor structure of FIG. 8.

Referring now to FIG.8, an SV sensor is shown having an active SV structure formed in the central region 802 and having conductive lead structures 840 and 845 formed in the end regions 804 and 806. The conductive lead structures 840 and 845 comprise a first layer seed 846 of Ta, a second seed layer 847 of Cr, and a conductive lead layer 848 of Ta according to the present invention.

As can be seen from the foregoing, the present invention provides a conductive leads structure comprising a multi-layer seed for a conductive lead used for applications in an MR head. The use of a bi-layer seed structure for the seed layer on which conductive leads are deposited on thin MR sensor devices, improves the conductance of the leads on these thin sensors. The use of multilayer, and in particular bi-layer seed structures provides improved isolation from the effects of sublayer thickness and structure on the conductance of the conductive leads.

While the invention has been particularly shown and described with reference to a preferred embodiment, it will be understood by those skilled in the art that various changes in form and detail may be made therein without departing from the spirit and scope of the invention.

What is claimed is:

1. A magnetoresistive (MR) sensor having end regions separated from each other by a central region, said MR sensor comprising:
   an MR material formed in said central region;
   a biasing materials formed in each of said end regions for longitudinally biasing said MR material; and
   a conductive lead structure formed in each of said end regions for receiving electrical current, said conductive lead structures including:
      a multi-layer of refractory metals where the refractory metal of each layer in said multi-layer is alternately chosen from a first and a second refractory metal, said first refractory metal being different from said second refractory metal and
      a conductor lead formed over and in contact with said multilayer of refractory metals.

2. The MR sensor of claim 1 wherein the refractory metals are selected from a group of material consisting of tantalum, tungsten, chromium, titanium and niobium.

3. The MR sensor of claim 2 wherein the first refractory metal is tantalum and the second refractory metal is chromium and the conductive lead material is tantalum.

4. The MR sensor of claim 3 wherein the thickness of the first refractory metal is between fifteen Angstroms (15) and one hundred Angstroms (100 Å) and the thickness of the second refractory metal is between fifteen Angstroms (15 Å) and one hundred Angstroms (100 Å).

5. The MR sensor of claim 1 wherein the magnetoresistive sensor is a spin valve (SV) sensor.

6. The MR sensor of claim 1 wherein the magnetoresistive sensor is an anisotropic magnetoresistive sensor.

7. The MR sensor of claim 1 wherein the biasing material is cobalt-platinum-chromium.

8. A spin valve magnetoresistive (MR) sensor having first and second end regions separated from each other by a central region, said MR sensor comprising:
   a free ferromagnetic layer formed in said central region;
   a pinned ferromagnetic layer formed in said central region;
   a spacer layer formed between said free and pinned ferromagnetic layers;
   an antiferromagnetic layer for pinning the magnetization of said pinned layer;
   a biasing materials formed in said first and second end regions for longitudinally biasing said MR material; and
   a conductive lead structure formed in each of said first and second end regions for receiving electrical current, said conductive lead structures including:
      a multi-layer of refractory metals where the refractory metal of each layer in said multi-layer is alternately chosen from a first and a second refractory metal, said first refractory metal being different from said second refractory metal; and
      a conductor lead formed over and in contact with said multilayer of refractory metals.

9. The spin valve sensor of claim 8 wherein the refractory metals are selected from a group of material consisting of tantalum, tungsten, chromium, titanium and niobium.

10. The spin valve sensor of claim 9 wherein the first refractory metal is tantalum and the second refractory metal is chromium and the conductive lead material is tantalum.

11. The spin valve sensor of claim 10 wherein the thickness of the first refractory metal is between fifteen Angstroms (15 Å) and one hundred Angstroms (100 Å) and the thickness of the second refractory metal is between fifteen Angstroms (15 Å) and one hundred Angstroms (100 Å).

12. The spin valve sensor of claim 9 wherein the biasing material is cobalt-platinum-chromium.

13. A magnetic storage system comprising:
   a magnetic storage medium having a plurality of tracks for recording data;
   a magnetic transducer maintained in a closely spaced position relative to the magnetic storage medium during relative movement between the magnetic transducer and the magnetic storage medium, the magnetic transducer including; a magnetoresistive (MR) sensor having end regions separated from each other by a central region, said MR sensor comprising:
      an MR material formed in said central region;
      a biasing materials formed in each of said end regions for longitudinally biasing said MR material; and
      a conductive lead structure formed in each of said end regions for receiving electrical current, said conductive lead structures including:
         a multi-layer of refractory metals where the refractory metal of each layer in said multi-layer is alternately chosen from a first and a second refractory metal, said first refractory metal being different from said second refractory metal; and
         a conductor lead formed over and in contact with said multilayer of refractory metals;
      actuator means coupled to the magnetic transducer to move the magnetic transducer over selected tracks on the magnetic storage medium; and
      means coupled between the conductive lead structures for detecting resistance changes in the magnetoresistive material responsive to magnetic fields representative of data bits recorded in the magnetic storage medium intercepted by the layer of magnetoresistive material.

14. The magnetic storage system of claim 13 wherein the refractory metals are selected from the group of material consisting of tantalum, tungsten, chromium, titanium and niobium.

15. The magnetic storage system of claim 13 wherein the first refractory metal is tantalum and the second refractory metal is chromium and the conductive lead material is tantalum.

16. The magnetic storage system of claim 15 wherein the thickness of the first refractory metal is between fifteen Angstroms (15 Å) and one hundred Angstroms (100 Å) and the thickness of the second refractory metal is between fifteen Angstroms (15 Å) and one hundred Angstroms (100 Å).

17. The magnetic storage system of claim 13 wherein the magnetoresistive sensor is a spin valve (SV) sensor.

18. The magnetic storage system of claim 13 wherein the magnetoresistive sensor is an anisotropic magnetoresistive sensor.

19. The magnetic storage system of claim 13 wherein the biasing material is cobalt-platinum-chromium.

20. A magnetoresistive (MR) sensor having end regions separated from each other by a central region, said MR sensor comprising:
   an MR material formed in said central region;
   a biasing materials formed in each of said end regions for longitudinally biasing said MR material; and
   a conductive lead structure formed in each of said end regions for receiving electrical current, said conductive lead structures including:

a first seed layer of a first refractory metal, a second seed layer of a second refractory metal, said second seed layer being formed over said first seed layer, said second refractory metal being different from said first refractory metal; and a conductor lead formed over and in contact with said second seed layer.

21. The MR sensor of claim 20 wherein the refractory metals are selected from a group of material consisting of tantalum, tungsten, chromium, titanium and niobium.

22. The MR sensor of claim 20 wherein the first refractory metal is tantalum and the second refractory metal is chromium and the conductive lead material is tantalum.

23. The MR sensor of claim 22 wherein the thickness of the first refractory metal is between fifteen Angstroms (15 Å) and one hundred Angstroms (100 Å) and the thickness of the second refractory metal is between fifteen Angstroms (15 Å) and one hundred Angstroms (100 Å).

24. The MR sensor of claim 20 wherein the magnetoresistive sensor is a spin valve (SV) sensor.

25. The MR sensor of claim 20 wherein the magnetoresistive sensor is an anisotropic magnetoresistive sensor.

26. The MR sensor of claim 20 wherein the biasing material is cobalt-platinum-chromium.

* * * * *